US011700703B2

(12) United States Patent
Bousquet et al.

(10) Patent No.: US 11,700,703 B2
(45) Date of Patent: Jul. 11, 2023

(54) METHOD FOR INSERTING, LOCKING AND EXTRACTING AN ELECTRONIC MODULE AND HOUSING STRUCTURE FOR IMPLEMENTING SAME

(71) Applicant: LATELEC, Labege (FR)

(72) Inventors: Jean Francois Bousquet, Brugieres Occitanie (FR); Bastien Puertolas, Auzeville Tolosane Occitanie (FR)

(73) Assignee: LATELEC, Labege Occitanie (FR)

( * ) Notice: Subject to any disclaimer, the term of this patent is extended or adjusted under 35 U.S.C. 154(b) by 419 days.

(21) Appl. No.: 16/765,525

(22) PCT Filed: Nov. 17, 2018

(86) PCT No.: PCT/EP2018/081662
§ 371 (c)(1),
(2) Date: May 20, 2020

(87) PCT Pub. No.: WO2019/097040
PCT Pub. Date: May 23, 2019

(65) Prior Publication Data
US 2020/0323095 A1    Oct. 8, 2020

(30) Foreign Application Priority Data
Nov. 20, 2017  (FR) ...................................... 1760899

(51) Int. Cl.
*H05K 7/14*     (2006.01)
*B64D 41/00*    (2006.01)

(52) U.S. Cl.
CPC ........... *H05K 7/1409* (2013.01); *B64D 41/00* (2013.01); *H05K 7/1412* (2013.01); *H05K 7/1438* (2013.01)

(58) Field of Classification Search
USPC ....... 361/809, 727, 756, 759, 752, 796, 800, 361/801–803, 807
See application file for complete search history.

(56) References Cited

U.S. PATENT DOCUMENTS 6,094,358 A  *  7/2000  Christensen .............  H05K 1/14
                                                          439/372
6,406,312 B1    6/2002  Heitkamp
(Continued)

FOREIGN PATENT DOCUMENTS

EP    1084597    3/2001
EP    2542042    1/2013
(Continued)

*Primary Examiner* — Hung S. Bui
(74) *Attorney, Agent, or Firm* — Defillo & Associates, Inc; Evelyn A. Defillo (57) ABSTRACT

The invention relates to a structure (1) for housing electronic modules (2) provided with a system for inserting, locking and extracting such modules (2) including adjacent individual recesses separated by side rails and a motherboard (13), each recess being intended for receiving an electronic module (2). The system for inserting, locking and extracting includes one lever arm (3) per individual recess (10) provided at a distal end with a device for pivoting on the motherboard (13) and guiding device (31) capable of engaging with a circulation device (22, 22') connected to the electronic module (2) in order to couple connectors of the electronic module (2) with the connectors of the motherboard (13), as well as a device for automatic locking and unlocking of a proximal end (3p) of each lever arm (3).

9 Claims, 4 Drawing Sheets

(56) References Cited

U.S. PATENT DOCUMENTS

| | | |
|---|---|---|
| 6,797,879 B2 | 9/2004 | Leyda |
| 7,894,210 B1 * | 2/2011 | Searby ................. H05K 7/1424 |
| | | 361/752 |
| 9,648,773 B1 * | 5/2017 | An .......................... G06F 1/187 |
| 10,197,084 B1 * | 2/2019 | Ankney .................. F16B 21/09 |
| 2005/0174743 A1 | 8/2005 | Downing |
| 2008/0045051 A1 | 2/2008 | Sato |
| 2009/0212182 A1 * | 8/2009 | Ding ....................... G06F 1/187 |
| | | 248/225.11 |
| 2016/0149381 A1 * | 5/2016 | Morrison ............ H05K 7/1447 |
| | | 244/129.1 |

FOREIGN PATENT DOCUMENTS

| | | |
|---|---|---|
| EP | 3008983 | 4/2016 |
| FR | 3038203 | 12/2016 |

* cited by examiner

METHOD FOR INSERTING, LOCKING AND EXTRACTING AN ELECTRONIC MODULE AND HOUSING STRUCTURE FOR IMPLEMENTING SAME

CROSS REFERENCE TO RELATED APPLICATION

This application is a national stage entry of PCT/EP2018/081662 filed Nov. 17, 2018, under the International Convention claiming priority over French Patent Application No. FR1760899 filed Nov. 20, 2017.

TECHNICAL FIELD

The invention relates to a method for inserting, locking and extracting electronic modules, and to a structure housing such modules which is equipped with a system for inserting, locking and extracting such modules implementing this method. The method relates also to an avionics bay consisting of a set of housing structures of this type and intended to connect electrical/electronic equipment via wiring distributed throughout an aircraft, and to the aircraft comprising such an avionics bay.

BACKGROUND OF THE INVENTION

The invention relates to the organization of the connections for the electrical/electronic processing and management of equipment of mechanical type (valves, pumps, etc.) or electrical/electronic type (electrical cores, computers, navigation sensors, converters, batteries, etc.), in the fields of transportation, in particular in aeronautics, space or computing.

The connections are generally made using electronic modules ("blades"), incorporating boards and electronic components, and which are packaged in the form of thin casings in a housing structure to be easily replaced therein. The removable modules are called LRUs ("line replaceable units") or LRMs ("line replaceable modules") depending on whether they relate to an entire equipment item or a subunit of this equipment item.

Each housing structure is composed of individual slots arranged parallel to one another to receive each of the modules in vertical position and takes the form of a rack, cupboard, cabinet, locker depending on the size thereof. The housing structures are also equipped with ventilation apertures for cooling the removable modules. In the case of an aircraft, the set of housing structures constitutes an avionics bay.

Each removable module is provided on a rear face with at least one connection plug that can be coupled or uncoupled in a connection interface with one or more associated connection sockets, incorporated in a back wall called "back panel" of the housing structure. In an aircraft, the avionics bay is connected through this interface, directly or by inter-blade connection, to different operational equipment items distributed throughout the aircraft according to a network architecture, via electrical/optical cable wiring looms, and an onboard electrical power supply network.

An avionics bay is preferably located in the front lower part of the fuselage, under the cockpit, in controlled pressure and temperature conditions. Mechanical structures are advantageously provided in the zone accommodating the bay to ensure that the housing structures are kept linked with their immediate environment and to form a passage for the ventilating air flows for these housing structures. For the LRUs, these mechanical structures conform to the ARINC series 600 standard: an assembly equipped with locking means according to this standard is for example described in the patent document U.S. Pat. No. 6,797,879.

The increase and the diversification of the equipment are leading to the appearance of wirings and connections of various configurations and kinds (for example electrical or optical). In order to simplify the insertion and the extraction of the modules while preserving a good connection of the electrical links, solutions have been developed based on insertion, extraction and locking means mounted on the electronic modules or on the housing structures.

For example, the document EP 2 542 042 discloses a device for locking electronic boards in a cabinet. Each electronic board is inserted into a casing equipped with two levers, an extraction lever and a locking lever. These levers extend over the bottom plate of the frame of the cabinet and are rotationally mobile about lateral axes parallel to the front of the frame. The end of the extraction lever is configured to come into abutment on an extension of the locking lever, so that it is not possible to continue a joint movement of the levers and thus manipulate the levers in an inappropriate order.

The document EP 1 084 597 discloses another mechanism also mounted on the electronic module. This mechanism comprises a double lever linked to a single handle, the assembly being mounted on a spring to take up the plays and apply a securing effort in the locked position.

Other systems are arranged on the rack of the housing structure. In this category, the document EP 3 008 983 describes a single pivoting handle exerting a double movement of the casing of the housing cupboard: first of all a lateral transverse positioning movement on one side of the cupboard, then a translational movement at right angles to the lateral movement for the insertion of the module toward the rear of the cupboard.

However, these insertion, locking and extraction systems generate the application of a significant effort in insertion and in extraction because of the high number of contacts to be managed at the connection interface. The presence of gearing-down mechanisms is therefore added to reduce this effort.

Furthermore, the known systems are all mounted on the front face of the modules or of the housing structures. This generates an increase in weight: the effort path, to ensure the coupling of the module to the connector, runs over all of its depth and that of its housing structure. Thus, the structure of the module and that of the housing structure are then dimensioned to withstand these efforts, hence the increase in weight.

Furthermore, these known systems require a strict control of the position of the two connectors—those of the modules and those of the back panel to ensure a good coupling interface. Thus, a string of complex dimensions running through the module, the housing structure, the two connectors and the insertion systems needs to be implemented by precise machinings and assemblies. Alternatively, a complex, spring-based play take-up device—described for example in the document EP 1 084 597 cited above—or a tightening mechanism requiring a specific control procedure of ARINC lock type as in the document U.S. Pat. No. 6,797,879 already cited—can be used.

Moreover, it is known practice to add a so-called "bottoming" (that is to say positioned at the bottom) spring-based mechanism for the placement and the holding in position of the connectors. This mechanism produces a permanent effort guaranteeing contact in the conditions of use.

The changes to the format of the new generation modules is generally tending toward a smaller thickness and a higher height/depth ratio. This trend demands a distribution of the insertion and extraction efforts over all the height. Thus, to allow for manipulation without sticking, the system has two points of action based on two levers or handles, in the top and bottom parts, manipulated with both hands, generating a risk of manipulation error. Alternatively, a single lever or handle can be used via a mechanism incorporating two activation points. Here again, the mechanisms are complex and add weight.

SUMMARY OF THE INVENTION

The invention aims to allow for the insertion, extraction and locking of electronic modules by reducing the weight and complexity of the system compared to the existing solutions, by a manipulation in a single operation, without tools or adjustment, with an automatic locking of the module. Furthermore, the invention remains compatible with a back panel mounting of bottoming type and of varying module formats.

For this, the invention provides for acting not on the module or on its housing structure as close as possible to the operator, but directly as close as possible to the connection interface by the exercising an effort at the rear of the module.

More specifically, one subject of the present invention is a method for inserting, locking and extracting electronic modules reversibly connected with a back panel of a housing structure configured with individual slots for each of the electronic modules. This method consists in carrying out the following steps for the locking of each electronic module:

introducing the electronic module into an individual slot until a start of pivoting of an effort gearing-down lever is released and triggered by a mobile link formed between a distal end of said gearing-down lever mounted to rotate on the back panel and the electronic module;

exerting a pressure on said lever from a proximal end of this lever to continue the pivoting of the lever, move the electronic module against the back panel by the orientation of the mobile link and connect the electronic module to the back panel by a transference of the insertion efforts in a connection interface;

completing the pivoting of the lever to achieve a position of automatic locking of its proximal end by triggering a locking mechanism;

and, for the extraction of each electronic module:

acting on the locking mechanism to unlock the proximal end of the lever, pivot the lever in the reverse direction of the locking direction to disconnect the electronic module by transference of the uncoupling efforts in the connection interface, and advance the electronic module in its slot before removing the electronic module.

According to advantageous embodiments:

the locking and unlocking states of the lever are validated by different visual indications on the automatic locking mechanism;

the mobile link between the distal end of the lever and the electronic module is formed by a guiding path;

the lever arm has a sufficient elasticity and/or the guiding path has an incurved form suitable for connecting the module to the back panel ("bottoming"), to achieve the locking while continuing to be lowered; even after connection, the guiding path comprises, at its end, a flexible reversible retaining zone when the proximal end of the lever is in locking position.

The invention relates also to a structure for housing electronic modules which is equipped with a system for inserting, locking and extracting such modules implementing the method defined above. Such a housing structure comprises adjacent individual slots separated by lateral runners and a back panel provided with wiring connectors, each slot being intended to accommodate an electronic module. In this housing structure, the system for inserting, locking and extracting comprises a lever arm for each individual slot provided at a distal end with pivoting means on the back panel and guiding means suitable for cooperating with circulation means linked to the electronic module to couple connectors of the electronic module to the connectors of the back panel, as well as means for locking/automatic unlocking in raised position and for automatic locking/unlocking in lowered position of a proximal end of each lever arm.

According to preferred features:

the locking and unlocking states of the lever arm in lowered position are validated by a visual indicator via an aperture formed on a beveled proximal end face of the lever arm according to the position of the automatic locking mechanism comprising a bolt releasably coupled to the bottom plate between a locking position and an unlocking position;

the locking/automatic unlocking mechanism of the lever arm in raised position comprises securing means that can be released under pressure from the ball pushbutton;

the lever is made of a sufficiently flexible material, in particular steel alloy or titanium covered with elastomer, to serve as elastic abutment for the protuberance;

the guiding means comprise a cam path in which a protuberance can circulate, this protuberance being chosen between a snug, a pin and a roller;

each lever arm is composed of two branches intended to bracket each lateral face of an electronic module.

BRIEF DESCRIPTION OF THE FIGURES

Other data, features and advantages of the present invention will emerge from reading the following nonlimited description, with reference to the attached figures, which represent, respectively.

DETAILED DESCRIPTION

In the present text, the qualifiers "top" and "bottom", and their derivatives or equivalents, relate to relative positions of parts of elements in standard configurations of use, in particular to the raised and lowered relative positions of the lever arms according to the invention. The qualifier "lateral" relates to faces or walls at right angles to the front or back faces.

Figure 1:
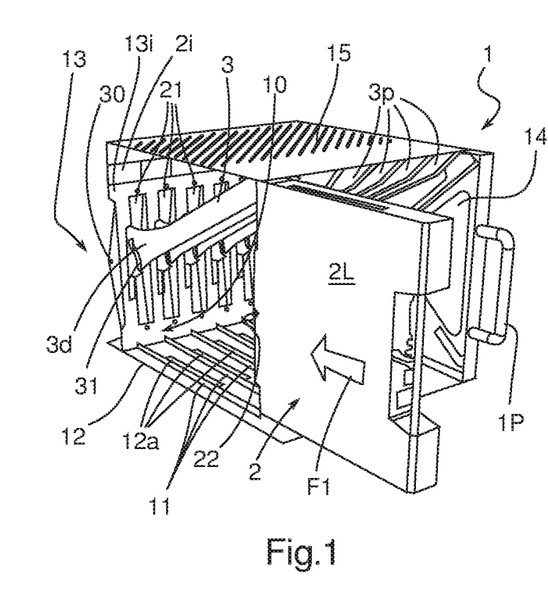
FIG. 1, a perspective view of an example of a rack housing electronic module according to the invention upon the introduction of a module.

The perspective view of FIG. 1 illustrates an example of a parallelepipedal housing rack 1 for electronic modules according to the invention, such as the module 2. A part of the rack 1 has been eliminated to show the introduction (arrow F1) of the electronic module 2 in the foreground. This rack 1 comprises individual slots 10 for electronic modules, aligned adjacently and separated by runners 11 extending along a bottom plate 12. The rack 1 is also composed of a back panel 13 equipped with aligned connectors 21 on its internal face 13i, each connector 21 being intended to be coupled to rear connectors 2C (see FIG. 1b) of a module such as the electronic module 2, and two lateral walls 14 (just one being visible in FIG. 1) provided with handles 1P.

The rack 1 also accommodates an interconnection board 2i between the electronic modules 2. The interconnection boards 2i are composed of printed circuits called "backplanes". These "backplanes" 2i are mounted on the internal face 13i of the back panel structure 13, above and/or below the connectors 21. The rack 1 and the insertion of the modules with such a rack also ensure the positioning and the securing of each module 2 relative to these backplanes 2i. Furthermore, the rack 1 is provided with orifices 12a on each individual slot 10 in its bottom plate 12, allowing the passage of a flow of air to cool the modules 2 once installed.

According to the invention, each module slot 10 is equipped with a lever arm 3 extending laterally and provided, at a distal end 3d, with an orifice (not visible) cooperating with a rotation journal 30 fixed to the back panel 13. This distal end 3d is also provided with a cam path 31 capable of allowing the circulation of a snug 22 mounted to rotate on the rim of a lateral face 2L of the electronic module 2. This snug 22 appears in detail in the partial rear view of the electronic module 2 of FIG. 1b. Alternatively, or together, a snug 22' fixed onto the connector 2C of the rear face 2A of the electronic module 2 appears also in this FIG. 1b. The circulation of the snug 22 in the cam path 31 is intended to allow a controlled connection between this module 2 and the back panel 13, as will be described in detail hereinbelow.

Figure 1A:
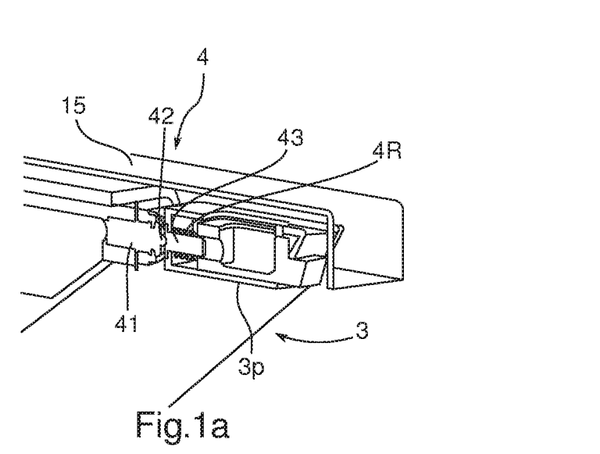
FIG. 1a, shows a cross-sectional view of the releasable securing mechanism of a lever arm of the insertion, locking and extraction system of the rack according to FIG. 1.
Figure 1B:
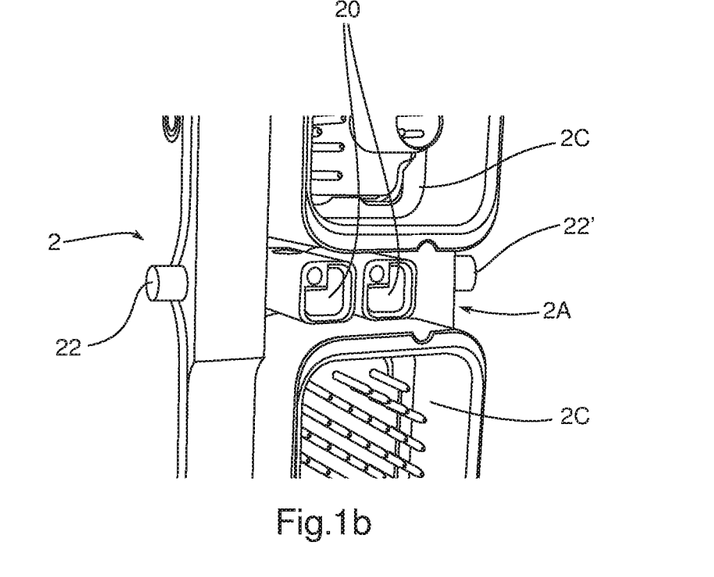
FIG. 1b, shows a partial rear view of the electronic module introduced into the housing rack of FIG. 1.

Furthermore, the connectors 2C of the module 2 and the connectors 21 of the back panel 13 are here provided with foolproofing keys as illustrated by the items 20 of the module 2 of FIG. 1b. This foolproofing prevents a module 2 from being erroneously plugged in the wrong slot in the rack 1. In case of error, the lever arm 3 is not presented to the operator, even if he or she pushes the module 2 to the back of its slot. Advantageously, the cam path 31, by virtue of its form, accommodates the snug 22 only once the foolproofing zone has been crossed.

Thus, the lever arm 3 is automatically lowered, to be able to be manipulated, only if the right module 2 is positioned in the right slot in the rack 1.

Each lever arm 3 is kept in raised position on the top plate 15 of the rack 1 by a releasable mechanism 4 illustrated by the cross-sectional view of FIG. 1a. This releasable securing mechanism 4 comprises a ball pushbutton 41, mounted on the top plate 15. The proximal end 3p of the lever arm 3 comprises a spherical notch 43 which allows for a releasable securing of this lever arm 3 in raised position by contact of this notch 43 against the ball 42 under the force of the ball pushbutton 41.

Figure 2:
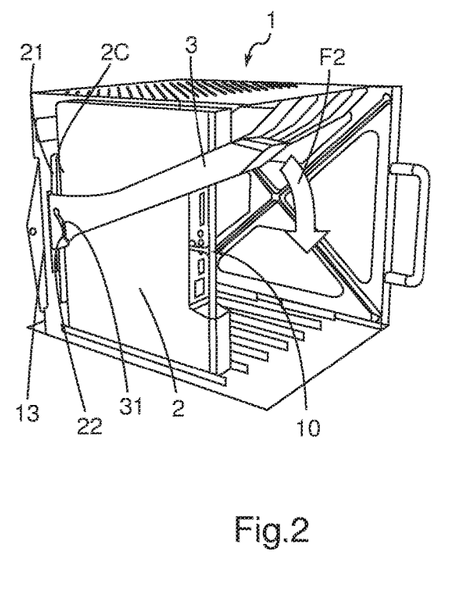
FIG. 2, shows a perspective view of a rack according to FIG. 1 upon the pivoting of said lever arm after uncoupling.

As illustrated by the perspective view of FIG. 2, the advancing of the electronic module 2 in its slot 10 (arrow F1 of FIG. 1) induces the entry of the snug 22 of this module 2 into the cam path 31. The continued advancement of the module 2 is then engaged by swiveling of the lever arm 3 performed by the operator (arrow F2). This swiveling provokes the advancement of the snug 22 in the cam path 31 and the coupling of the connectors 2C of the module 2 and of the connector 21 of the back panel 13 by transference of the insertion efforts geared down in the common connection interface formed between these connectors 2C and 21.

Figure 3:
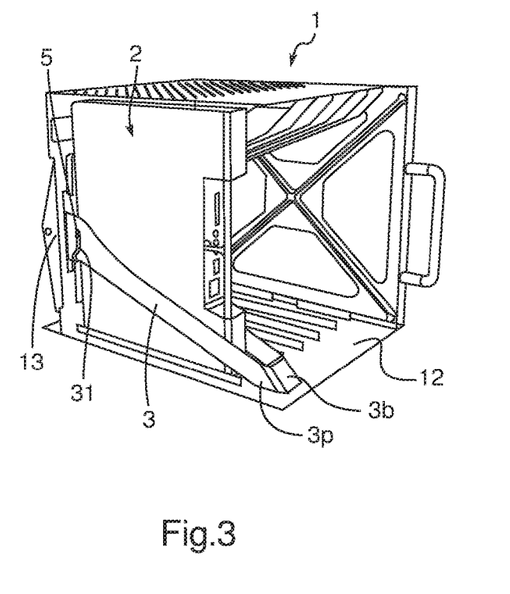
FIG. 3, shows a perspective view of a rack according to FIG. 1 upon the locking of said lever arm.

When the lever arm 3 reaches the bottom plate 12 (FIG. 3), a spring-operated automatic locking/unlocking mechanism, which will be described hereinbelow with reference to FIGS. 4 and 4a, reversibly fixes the proximal end 3p of the lever arm 3 to the bottom plate 12. The connection between the electronic module 2 and the back panel 13 is then blocked by virtue of an abutment 5 formed at the end of the cam path 31. Advantageously, the operator is informed of the locking position of the electronic module 2 by the prior deposition of a green colored layer on a beveled proximal end face 3b of the lever arm 3 via an aperture 46.

Figure 4:
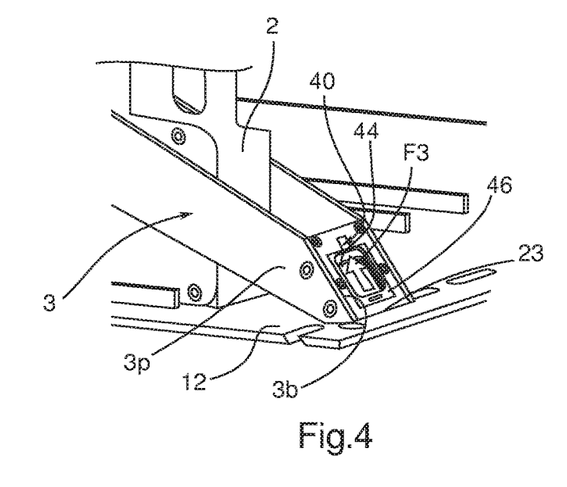
FIG. 4, shows a perspective view of a rack according to FIG. 1 upon the unlocking of the lever arm.
Figure 4A:
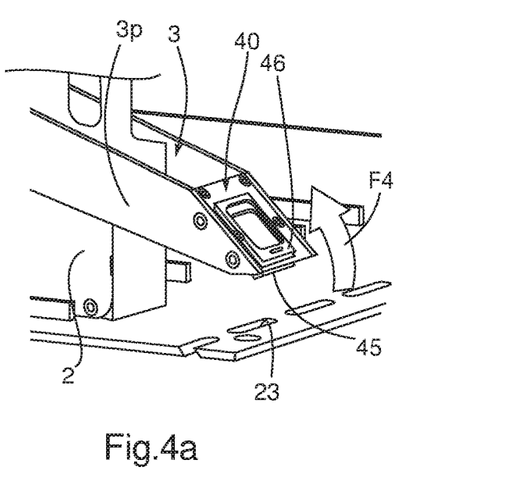
FIG. 4a, shows a perspective view of a rack according to FIG. 1 of the start of pivoting of said arm after unlocking.

According to a reverse kinematic, the extraction of the electronic module 2 from the rack 1 begins with a step of unlocking of the proximal end 3p of the lever arm 3, as shown with reference to FIG. 4. For this, the operator exerts an extraction force on a hollow element 44 (arrow F3) linked with the spring-operated locking/unlocking mechanism 40 incorporated in the proximal end 3p of the arm 3 (this mechanism 40 is seen by transparency). This force slides (arrow F3) a bolt 45 (see FIG. 4a) out of a slit 23 of the bottom plate 12, allowing the operator to release swivel the arm 3. The aperture 46 of the beveled end face 3b of the lever arm 3 then reveals, because of the new position of the locking/unlocking mechanism 40, a red colored layer deposited on a face of the locking/unlocking mechanism 40. In a second step illustrated by with reference to FIG. 4a, the proximal end 3p of the lever arm 3 is pivoted up (arrow F4) after the bolt 45 has come out of the slit 23 in which it was housed.

Figure 5:
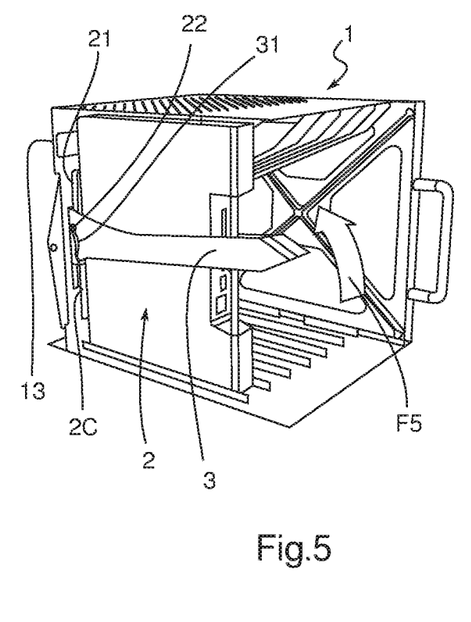
FIG. 5, shows a perspective view of a rack according to FIG. 1 after unlocking and returning said arm to attachment position.
Figure 6:
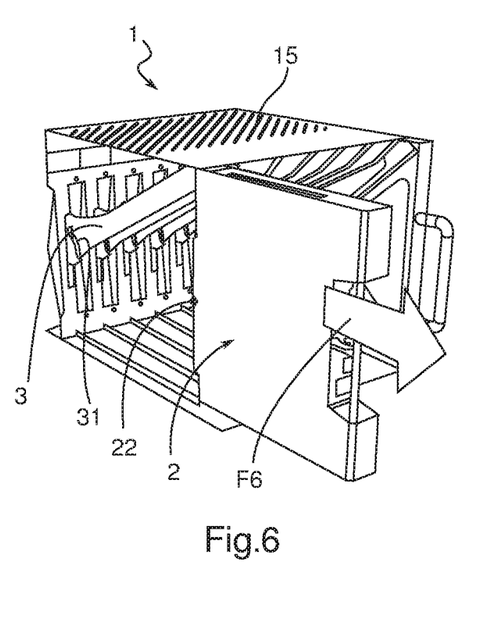
FIG. 6, shows a perspective view of a rack according to FIG. 1 upon the extraction of the electronic module with attachment of the lever arm.

The continued raising of the lever arm 3 is illustrated by FIG. 5. During this raising (arrow F5), the snug 22 is moved in the cam path 31 along the reverse trajectory, while, simultaneously, the connectors 2C and 21, respectively of the electronic module 2 and of the back panel 13, are detached in a continuous movement. When the lever arm 3 is held again on the top plate 15 (see FIG. 1*b*), the snug 22 has come out of the cam path 31 and the electronic module 2 is extracted by the operator, as illustrated by the arrow F6 of FIG. 6.

The travel of the snug 22 in the cam path 31 upon insertion to the connection of the electronic module 2 in the rack 1 is described hereinbelow with reference to the steps of the partial lateral cross-sectional view of FIGS. 7*a* to 7*c*.

In these figures, the cam path 31 has an "S" configuration and, at its closed end 31*b*, the abutment 5 forming a reversible retainer for the snug 22. The lever arm 3 can pivot in rotation by the link to the back panel 13 via the journal 30. The cam path 31, the snug or snugs 22, 22' (FIG. 1*b*), the levers 3 and their journal pivoting mechanism 30, the automatic locking/unlocking mechanism 40 and the releasable securing mechanism 4 of the levers 3 form an example of a system for inserting, extracting and locking according to the invention.

Figure 7A:
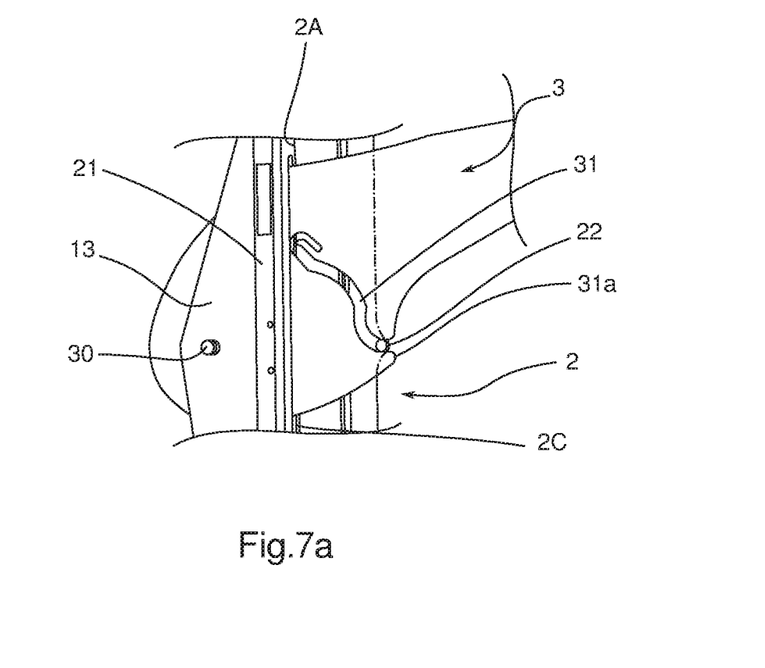
FIG. 7a, shows a partial lateral view of the back panel of the rack according to FIG. 1 showing a first position of the snug of the electronic module in the cam path of the lever arm upon the insertion and the connection of said module in said back panel.
Figure 7B:
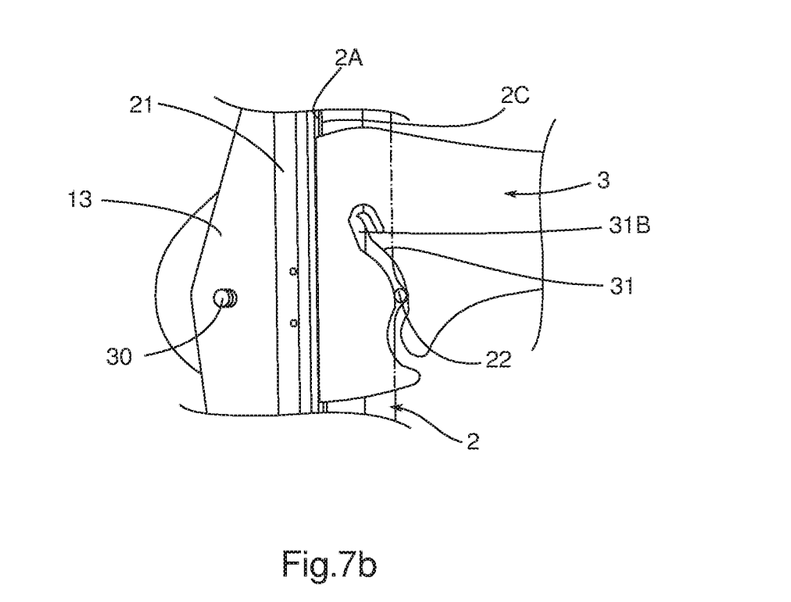
FIG. 7b, shows a partial lateral view of the back panel of the rack according to FIG. 1 showing a second position of the snug of the electronic module in the cam path of the lever arm upon the insertion and the connection of said module in said back panel.
Figure 7C:
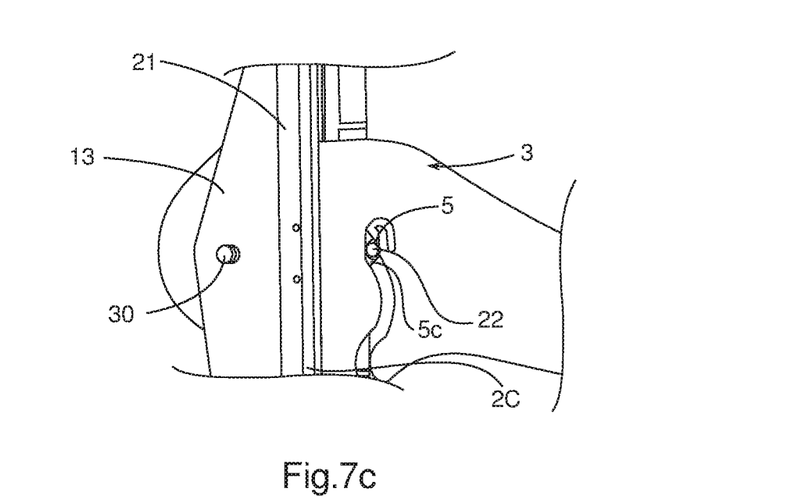
FIG. 7c, shows a partial lateral view of the back panel of the rack according to FIG. 1 showing a third position of the snug of the electronic module in the cam path of the lever arm upon the insertion and the connection of said module in said back panel.

Referring to FIG. 7*a*, the position of the lever arm 3 corresponds to the accurate entry of the snug 22 into the open end 31*a* of the cam path 31. As the lever arm 3 is lowered, the snug 22 goes up in the cam path 31 and the connector 2C of the rear face 2A of the electronic module 2 approaches the connector 21 of the back panel 13 (FIG. 7*b*). The lever arm 3 is lowered more and, when a slight additional thrust allows a blocking of the lever arm 3, the snug 22 is releasably retained in a hollow 5*c* formed by an elastic abutment 5, the connectors 2C and 21 being coupled accurately and securely. Alternatively, the lever arm 3 is made of a sufficiently flexible material, a plastic material, or of a metal alloy covered with an elastomer layer, to be able to serve as elastic abutment for the snug 22.

The invention is not limited to the exemplary embodiments described and represented. In particular, the automatic locking/unlocking mechanism can be produced by any spring, blade or equivalent return means. Furthermore, as an alternative to the embodiment illustrated, the automatic locking/unlocking and releasable securing mechanisms of the levers can be arranged respectively on the bottom plate and on the lever arms, the lever arm can have one or two branches, protuberances for circulation in the cam paths can be fixed onto the walls of the modules or onto the lever arms and, reciprocally, the cam paths can be formed in the lever arms or on the walls of the modules.

Furthermore, the cam paths of the lever arms, the snugs for circulation in these cam paths, the lever arms and their pivoting mechanism, the automatic locking/unlocking mechanism and the releasable securing mechanism of the lever arms and their variants form examples of insertion, extraction and locking systems according to the invention.

The invention claimed is:

1. A housing structure (1) for electronic modules (2) equipped with a system for inserting, locking, and extracting the electronic modules (2), the housing structure (1) comprising;
    adjacent individual slots (10) separated by lateral runners (11) and
    a back panel (13) provided with wiring connectors (21), each slot (10) being intended to accommodate an electronic module (2), the electronic module having boards and electronic components which are packaged in the form of a thin casing;
the system for inserting, locking and extracting comprises a lever arm (3) for each individual slot (10) provided at a distal end (3*d*) with a pivoting device (30) on the back panel (13) and a guiding device (31) for cooperating with a circulation device (22, 22') inked to the electronic module (2) to couple connectors (2C) of the electronic module (2) to the connectors (21) of the back panel (13), as well as a device locking/automatic unlocking in raised position (41 to 43) and for automatic locking/unlocking (40, 44, 45) In lowered position of a proximal end (3*p*) of each lever arm (3).

2. The housing structure as claimed in claim 1, wherein the lever arm (3) is made of a flexible material serving as elastic abutment for the protuberance (22, 22').

3. The housing structure as claimed in claim 1, wherein the guiding device comprise a cam path (31) In which a protuberance (22, 22') can circulate, the protuberance (22, 22') being chosen between a snug, a pin, or a roller.

4. The housing structure as claimed in claim 1, wherein each lever arm (3) is composed of two branches intended to bracket each lateral face (2L) of an electronic module (2).

5. The housing structure as claimed in claim 1, wherein the connectors (2C) of each module (2) and the connectors (21) of the back panel (13) are provided with fool proofing keys (20).

6. An aircraft avionics bay comprising a set of housing structures (1) as claimed in claim 1 and intended to connect electrical/electronic equipment via wiring distributed in the aircraft.

7. An aircraft comprising an avionics bay including a set of housing structures as claimed in claim 1, wherein the housing structures (1) are arranged on mechanical structures to allow a circulation of air between them and to transmit command signals to electrical/electronic equipment of the aircraft via electrical and/or optical wiring looms.

8. A housing structure (1) for electronic modules (2) equipped with a system for inserting, locking, and extracting the electronic modules (2), the housing structure (1) comprising;
    adjacent individual slots (10) separated by lateral runners (11) and
    a back panel (13) provided with wiring connectors (21), each slot (10) being intended to accommodate an electronic module (2);
    the system for inserting, locking and extracting comprises a lever arm (3) for each individual slot (10) provided at a distal end (3*d*) with a pivoting device (30) on the back panel (13) and a guiding device (31) for cooperating with a circulation device (22, 22') linked to the electronic module (2) to couple connectors (2C) of the electronic module (2) to the connectors (21) of the back panel (13), as well as a device locking/automatic unlocking in raised position (41 to 43) and for automatic locking/unlocking (40, 44, 45) in lowered position of a proximal end (3D) of each lever arm (3);
    wherein the locking and unlocking states of the lever arm (3) In lowered position are validated by a visual indicator via an aperture (45) formed on a beveled proximal end face (3*b*) of the lever arm (3) according to the position of the automatic locking mechanism (40) comprising a bolt (45) releasably coupled to the bottom plate (12) between a locking position and an unlocking position.

9. A housing structure (1) for electronic modules (2) equipped with a system for inserting, locking, and extracting the electronic modules (2), the housing structure (1) comprising:
    adjacent individual slots (10) separated by lateral runners (11) and
    a back panel (13) provided with wiring connectors (21), each slot (10) being intended to accommodate an electronic module (2);

the system for inserting, locking and extracting comprises a lever arm (3) for each individual slot (10) provided at a distal end (3*d*) with a pivoting device (30) on the back panel (13) and a guiding device (31) for cooperating with a circulation device (22, 22') linked to the electronic module (2) to couplie connectors (2C) of the electronic module (2) to the connectors (21) of the back panel (13), as well as a device locking/automatic unlocking in raised position (41 to 43) and for automatic locking/unlocking (40, 44, 45) in lowered position of a proximal end (3*p*) of each lever arm (3);

wherein the locking/automatic unlocking mechanism (41 to 43) of the lever arm (3) In raised position comprises a securing device (41 to 43) that are released under pressure from a ball pushbutton (41).

* * * * *